United States Patent
Hasegawa et al.

(10) Patent No.: US 9,711,945 B2
(45) Date of Patent: Jul. 18, 2017

(54) METHOD OF DESIGNING SEMICONDUCTOR LASER DEVICE, METHOD OF DESIGNING RAMAN AMPLIFIER, METHODS OF MANUFACTURING SEMICONDUCTOR LASER DEVICE, SEMICONDUCTOR LASER DEVICE, RAMAN AMPLIFIER, AND OPTICAL COMMUNICATION SYSTEM

(71) Applicant: FURUKAWA ELECTRIC CO., LTD., Tokyo (JP)

(72) Inventors: Hideaki Hasegawa, Tokyo (JP); Noriyuki Yokouchi, Tokyo (JP); Taketsugu Sawamura, Tokyo (JP); Satoshi Irino, Tokyo (JP); Junji Yoshida, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/177,175

(22) Filed: Jun. 8, 2016

(65) Prior Publication Data

US 2016/0285237 A1 Sep. 29, 2016

Related U.S. Application Data (63) Continuation of application No. PCT/JP2014/082173, filed on Dec. 4, 2014.

(30) Foreign Application Priority Data

Dec. 27, 2013 (JP) ................................ 2013-272986

(51) Int. Cl.
*H01S 5/14* (2006.01)
*H01S 3/067* (2006.01)
(Continued)

(52) U.S. Cl.
CPC .......... *H01S 5/146* (2013.01); *H01S 3/06754* (2013.01); *H01S 3/094011* (2013.01);
(Continued)

(58) Field of Classification Search
CPC .. H01S 5/146; H01S 5/02415; H01S 3/06754; H01S 3/302; H01S 5/141;
(Continued)

(56) References Cited

U.S. PATENT DOCUMENTS

| 6,567,447 B1 | 5/2003 | Yoshida et al. |
| 2001/0036204 A1 | 11/2001 | Hatta et al. |

(Continued)

FOREIGN PATENT DOCUMENTS

| JP | 2001-251014 A | 9/2001 |
| JP | 2002-050828 A | 2/2002 |

(Continued)

OTHER PUBLICATIONS

International Search Report mailed Feb. 24, 2015 for PCT/JP2014/082173 filed Dec. 4, 2014 with English Translation.

(Continued)

*Primary Examiner* — Dung Nguyen
(74) *Attorney, Agent, or Firm* — Oblon, McClelland, Maier & Neustadt, L.L.P.

(57) ABSTRACT

A method of designing a semiconductor laser device includes: controlling a distance between the output-side reflection unit and the second reflection unit and an effective optical feedback κ to the semiconductor laser element, the effective optical feedback κ defined by a below-presented formula (1) including a circulating time τ of the light in the semiconductor laser element, a reflectivity $R_1$ of the output-side reflection unit, and a reflectivity $R_2$ of the second reflection unit; selecting a semiconductor laser device in which an LFF period is equal to or smaller than 20 ns as a (Continued)

semiconductor laser device in which high speed switching occurs between an FBG mode and an FP mode; and using the selected semiconductor laser device as an semiconductor laser device oscillating in a coherent collapse mode.

$$\kappa = (1/\tau) \times (1 - R_1) \times (R_2/R_1)^{1/2} \qquad (1)$$

7 Claims, 7 Drawing Sheets

(51) Int. Cl.
  *H01S 3/094* (2006.01)
  *H01S 3/30* (2006.01)
  *H01S 5/024* (2006.01)
  *H01S 5/065* (2006.01)
  *H01S 5/022* (2006.01)

(52) U.S. Cl.
  CPC .......... *H01S 3/302* (2013.01); *H01S 5/02415* (2013.01); *H01S 5/0652* (2013.01); *H01S 5/141* (2013.01); *H01S 3/094096* (2013.01); *H01S 5/02208* (2013.01); *H01S 5/02248* (2013.01); *H01S 5/142* (2013.01); *H01S 2301/03* (2013.01)

(58) Field of Classification Search
  CPC ............. H01S 5/0652; H01S 3/094011; H01S 5/02208; H01S 5/142; H01S 3/094096
  See application file for complete search history.

(56) References Cited

U.S. PATENT DOCUMENTS

| | | | |
|---|---|---|---|
| 2001/0048702 A1 | 12/2001 | Yoshida et al. | |
| 2002/0136254 A1 | 9/2002 | Yoshida et al. | |
| 2007/0146699 A1* | 6/2007 | Wang | G01J 3/10 356/301 |
| 2015/0092800 A1* | 4/2015 | Zucker | H01S 5/0265 372/29.015 |
| 2015/0103858 A1 | 4/2015 | Yoshida et al. | |
| 2015/0311676 A1 | 10/2015 | Yoshida et al. | |

FOREIGN PATENT DOCUMENTS

| | | |
|---|---|---|
| JP | 2003-318480 A | 11/2003 |
| JP | 5074645 B2 | 8/2012 |
| WO | WO 2013/151145 A1 | 10/2013 |

OTHER PUBLICATIONS

International Written Opinion mailed Feb. 24, 2015 for PCT/JP2014/082173 filed Dec. 4, 2014.
M. Achtenhagen, et al., L-I Characteristics of Fiber Bragg Grafting Stabilized 980-nm Pump Lasers, IEEE Photonics Technology Letters, 2001, vol. 13, No. 5, pp. 415-417.
R. W. Tkach, et al., Regimes of Feedback Effects in 1.5-μm Distributed Feedback Lasers, Journal of Lightwave Technology, vol. LT-4, No. 11, pp. 1655-1661.
Notice of Reasons for Refusal issued May 7, 2014 in Japanese Application No. 2013-272986 with English Translation.
Notice of Reasons for Refusal issued Aug. 26, 2014 in Japanese Application No. 2013-272986 with English Translation.

* cited by examiner

METHOD OF DESIGNING SEMICONDUCTOR LASER DEVICE, METHOD OF DESIGNING RAMAN AMPLIFIER, METHODS OF MANUFACTURING SEMICONDUCTOR LASER DEVICE, SEMICONDUCTOR LASER DEVICE, RAMAN AMPLIFIER, AND OPTICAL COMMUNICATION SYSTEM

CROSS-REFERENCE TO RELATED APPLICATION

This application is a continuation of PCT International Application No. PCT/JP2014/082173 filed on Dec. 4, 2014 which claims the benefit of priority from Japanese Patent Application No. 2013-272986 filed on Dec. 27, 2013, the entire contents of which are incorporated herein by reference.

BACKGROUND

1. Field of the Disclosure

The present disclosure relates to a method of designing a semiconductor laser device for use in a pumping light source for Raman amplification, a method of designing a Raman amplifier, a method of manufacturing a semiconductor laser device, a semiconductor laser device, a Raman amplifier, and an optical communication system.

2. Description of the Related Art

The present disclosure relates to a method of designing a semiconductor laser device for use in a pumping light source for Raman amplification, a method of designing a Raman amplifier, a method of manufacturing a semiconductor laser device, a semiconductor laser device, a Raman amplifier, and an optical communication system.

BACKGROUND

In optical fiber communications, enlargement of a transmission distance and increase in a transmission capacity have been achieved by using an erbium doped optical fiber amplifier (EDFA). Recently, in addition to the EDFA, a Raman amplifier has been utilized to enlarge a transmission distance, to increase a capacity and to increase an output, etc.

The Raman amplifier as described above, and As disclosed in, for example, Japan Patent No. 5074645 and Japanese Patent Application Laid-open Publication No. 2002-50828 is used which includes a semiconductor laser device having a semiconductor laser element and a fiber Bragg Grating (FBG) and an optical fiber into which a laser light as a pumping light outputted from this semiconductor laser device is inputted and which makes a signal light be subjected to Raman amplification. Herein the semiconductor laser element includes a semiconductor light-emitting unit provided with an active layer, and an optical cavity having a first reflection unit (reflection layer) reflecting a light outputted by this semiconductor light-emitting unit.

In some cases, a laser light outputted by the semiconductor laser having the above-described optical cavity may be temporarily in a single-mode oscillation state in a spectrum area (longitudinal mode) at a low output side, for example, equal to or smaller than 50 mW. At a time of such single-mode oscillation, a problem will occur that an optical intensity per one longitudinal mode increases, stimulated Brillouin scattering (SBS) occurs by a non-linear optical effect in the optical fiber, and thus a stimulated Brillouin scattering light propagates as an optical feedback in the direction opposite to the light outputted by the semiconductor laser. This optical feedback may become a factor hindering stable operation of an optical communication system.

There is a need for a method of designing a semiconductor laser device capable of restraining stimulated Brillouin scattering in an optical fiber caused by a laser light outputted by a semiconductor laser device used in a pumping light source for Raman amplification, a method of designing a Raman amplifier, a method of manufacturing a semiconductor laser device, a semiconductor laser device, a Raman amplifier, and an optical communication system.

SUMMARY

A method of designing a semiconductor laser device according to one aspect of the present disclosure is used for a pumping light source for Raman amplification and including: a semiconductor laser element including an optical cavity including a semiconductor light-emitting unit and a first reflection unit reflecting a light outputted by the semiconductor light-emitting unit; and a second reflection unit disposed at a laser-light-output side of the semiconductor laser element, wherein the first reflection unit includes an output-side reflection unit provided at the laser-light-output side and a rear-end-side reflection unit provided at an opposite side to the laser-light-output side. The method of designing includes: controlling: a distance between the output-side reflection unit and the second reflection unit; and an effective optical feedback $\kappa$ to the semiconductor laser element, the effective optical feedback $\kappa$ defined by a below-presented formula (1) including a circulating time $\tau$ of the light in the semiconductor laser element, a reflectivity $R_1$ of the output-side reflection unit, and a reflectivity $R_2$ of the second reflection unit; selecting a semiconductor laser device in which an LFF period is equal to or smaller than 20 ns as a semiconductor laser device in which high speed switching occurs between an FBG mode and an FP mode; and using the selected semiconductor laser device as an semiconductor laser device oscillating in a coherent collapse mode, wherein the controlling is performed while measuring a relationship between an intensity of the laser light outputted from the semiconductor laser device and time to perform the selecting by finding out the semiconductor laser device in which the high speed switching occurs between the FBG mode and the FP mode, when measuring the relationship between the intensity of the laser light outputted from the semiconductor laser device and the time, the LFF period is defined as an interval between a reference peak at which decrease in the intensity is greatest in a predetermined time period and a nearest adjacent peak of which absolute value of the intensity is equal to or greater than 60% of the reference peak, and the semiconductor laser device at a time the defined LFF period is equal to or smaller than 20 ns is determined and selected as the semiconductor laser device to be used.

$$\kappa = (1/\tau) \times (1-R_1) \times (R_2/R_1)^{1/2} \qquad (1)$$

The above and other objects, features, advantages and technical and industrial significance of this disclosure will be better understood by reading the following detailed description of presently preferred embodiments of the disclosure, when considered in connection with the accompanying drawings.

DETAILED DESCRIPTION OF THE PREFERRED EMBODIMENTS

Hereafter, an embodiment of a method of designing semiconductor laser device 20, a method of designing a Raman amplifier 10, a method of manufacturing the semiconductor laser device 20, the semiconductor laser device 20, the Raman amplifier 10, and an optical communication system 100 according to the present disclosure will be explained with reference to the drawings. The present disclosure is not limited to the embodiment. In all the drawings, identical or corresponding elements are given same reference numerals appropriately. Moreover, it should be noted that the drawings show schematic examples. Accordingly, a relationship between respective elements may be different from real values. Among the drawings, there may be parts where the relationships and ratios of the shown sizes are different from one another.

Figure 1:
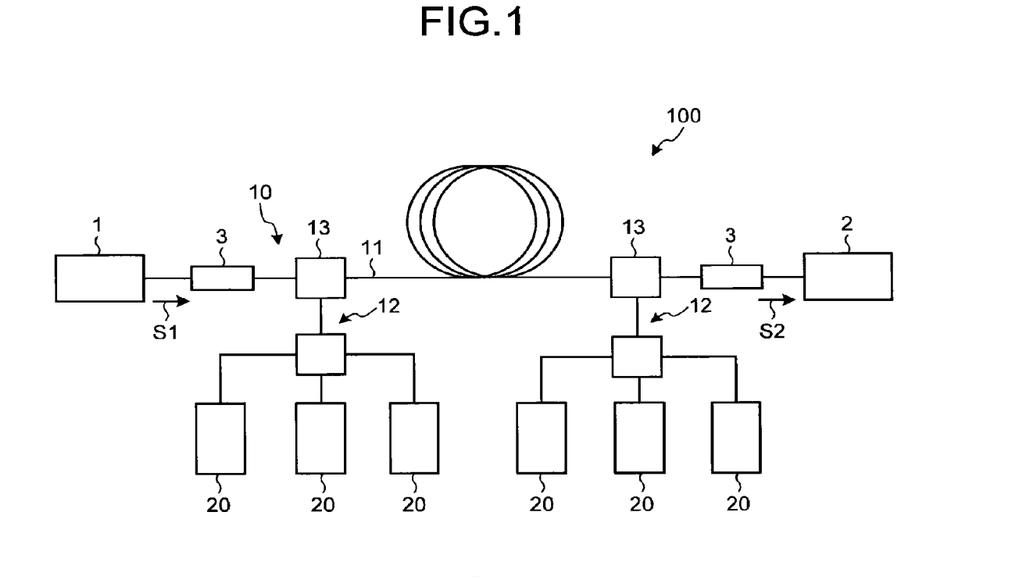
FIG. 1 is a schematic view for explaining an optical communication system and a Raman amplifier according to an embodiment of the present disclosure.

To start with, the optical communication system 100 and the Raman amplifier 10 provided with the semiconductor laser device 20 according to the embodiment of the present disclosure will be explained. FIG. 1 is a schematic view for explaining the optical communication system 100 and the Raman amplifier 10 according to the embodiment of the present disclosure. As illustrated in FIG. 1, the optical communication system 100 includes a transmitting unit 1 configured to transmit a signal light S1, the Raman amplifier 10 configured to Raman-amplify the signal light S1, and a receiving unit 2 configured to receive a signal light S2 that is the signal light S1 Raman-amplified by the Raman amplifier 10.

The Raman amplifier 10 includes a plurality of semiconductor laser devices 20, an optical fiber 11 to which laser lights outputted by the semiconductor laser devices 20 are inputted, a wavelength multiplexing unit 12, and an optical multiplexer/demultiplexer 13. The wavelength multiplexing unit 12 multiplexes the laser lights outputted by the plurality of semiconductor laser devices 20. The optical multiplexer/demultiplexer 13 multiplexes the laser lights multiplexed by the wavelength multiplexing unit 12 and the signal light S1, or demultiplexes the laser lights multiplexed by the wavelength multiplexing unit 12 and the signal light S2. An optical isolator 3 is disposed between the optical wavelength multiplexing unit 12 and the transmitting unit 1, and an optical isolator 3 is disposed between the optical wavelength multiplexing unit 12 and the receiving unit 2. The optical fiber 11 connects the transmitting unit 1 and the receiving unit 2 and serves as an optical transmission path through which the signal lights S1 and S2 are transmitted.

Figure 2:
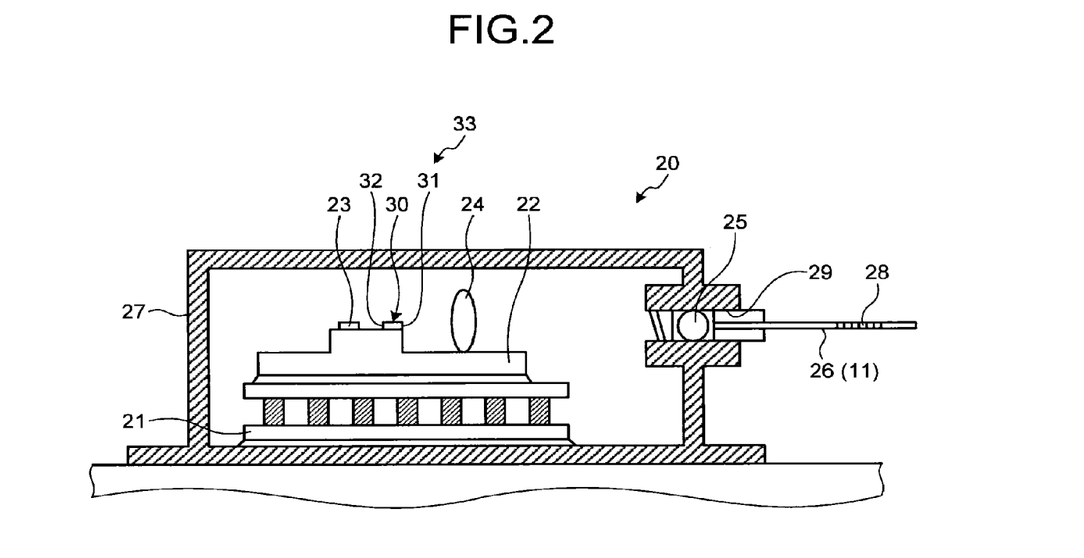
FIG. 2 is a schematic view for explaining of a semiconductor laser device according to the embodiment of the present disclosure.

The semiconductor laser device 20 is used as a pumping light source for Raman amplification. As illustrated in FIG. 2, the semiconductor laser device 20 includes: a Peltier module 21 that is an electronic cooling device; a substrate 22; a semiconductor laser element 30 provided with an optical cavity 33 having a first reflection unit; a thermistor 23; lenses 24 and 25; and an optical fiber 26 (11) having a second reflection unit 28 (fiber Bragg Grating). A package 27 accommodates those components.

The substrate 22 is arranged on one surface (an upper surface in FIG. 2) of the Peltier module 21. The semiconductor laser element 30, the thermistor 23, and the lens 24 are arranged on the one surface (the upper surface in FIG. 2) of the substrate 22. A through hole 29 is formed in a side wall of the package 27. The lens 25 and the optical fiber 26 are provided in the through hole 29, and the optical fiber 26 extends further to the outside of the package 27.

In this semiconductor laser device 20, the laser light outputted by the semiconductor laser element 30 is condensed by the lenses 24 and 25 and inputted to an end surface of the optical fiber 26, and then propagated in a core of the optical fiber 26. A part of the laser light propagated in the core is reflected by the second reflection unit 28 (fiber Bragg Grating) to return to the semiconductor laser element 30.

In the present embodiment, reflectivity $R_{FBG}$ of the second reflection unit 28 is, for example, within a range of 0.1% to 7.0%. A reflection bandwidth Δλ of the second reflection unit 28 is, for example, within a range of 0.1 nm to 30 nm.

Sometimes in a step of driving the semiconductor laser element 30, the semiconductor laser element 30 produces heat by a driving current and causes the element's temperature to increase, and thus the wavelength of the laser light inevitably fluctuates. Therefore, a temperature of the semiconductor laser element 30 is controlled to be stable by measuring the temperature of the semiconductor laser element 30 by the thermistor 23 provided in the vicinity of the semiconductor laser element 30 and operating the Peltier module 21 in accordance with the measured value.

Figure 3:
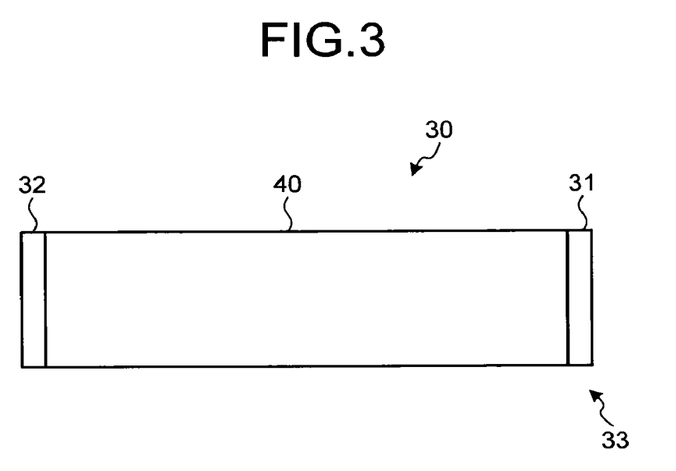
FIG. 3 is a schematic view for explaining a semiconductor laser element used in the semiconductor laser device according to the embodiment of the present disclosure.

As illustrated in FIG. 3, the semiconductor laser element 30 includes a semiconductor light-emitting unit 40 and the optical cavity 33 having the first reflection unit reflecting the light outputted by this semiconductor light-emitting unit 40. The first reflection unit includes: an output-side reflection unit 31 provided at a laser-light-output side (at a right-hand side in FIG. 2 and FIG. 3); and a rear-end-side reflection unit 32 provided at an opposite side to the laser-light-output side (at a left-hand side in FIG. 2 and FIG. 3). In the present embodiment, specifically, the output-side reflection unit 31 and the rear-end-side reflection unit 32 are reflection layers, and these output-side reflection unit 31 and rear-end-side reflection unit 32 serve as a Fabry-Perot type optical cavity. In the present embodiment, the wavelength of a light outputted from the semiconductor laser element 30 is within a range of 1.3 μm to 1.6 μm. The distance (a cavity length) between the output-side reflection unit 31 and the rear-end-side reflection unit 32 is set within a range of, for example, 0.2 mm to 10 mm.

The semiconductor light-emitting unit 40 extends in one direction (in a lateral direction in FIG. 3). The output-side reflection unit 31 and the rear-end-side reflection unit 32 are formed at one end (right-hand end) and at the other end (light-hand end) as end surfaces of the semiconductor light-emitting unit 40 respectively. In these output-side reflection unit 31 and rear-end-side reflection unit 32, reflectivity $R_{AR}$ of the output-side reflection unit 31 is set higher than reflectivity $R_{HR}$ of the rear-end-side reflection unit 32 ($R_{HR} > R_{AR}$).

That is, the reflectivity $R_{AR}$ of the output-side reflection unit 31 of the semiconductor laser element 30 is set lower than the reflectivity $R_{HR}$ of the rear-end-side reflection unit 32 disposed at the opposite side. More specifically, the reflectivity $R_{HR}$ of the rear-end-side reflection unit 32 is within a range of 90 to 100% and the reflectivity of the reflectivity $R_{AR}$ of the output-side reflection unit 31 is within a range of 0.1% to 10%.

Therefore, the semiconductor laser device 20 is configured so that a laser light is outputted from the one end side mainly (right-hand side in FIG. 3).

Figure 4:
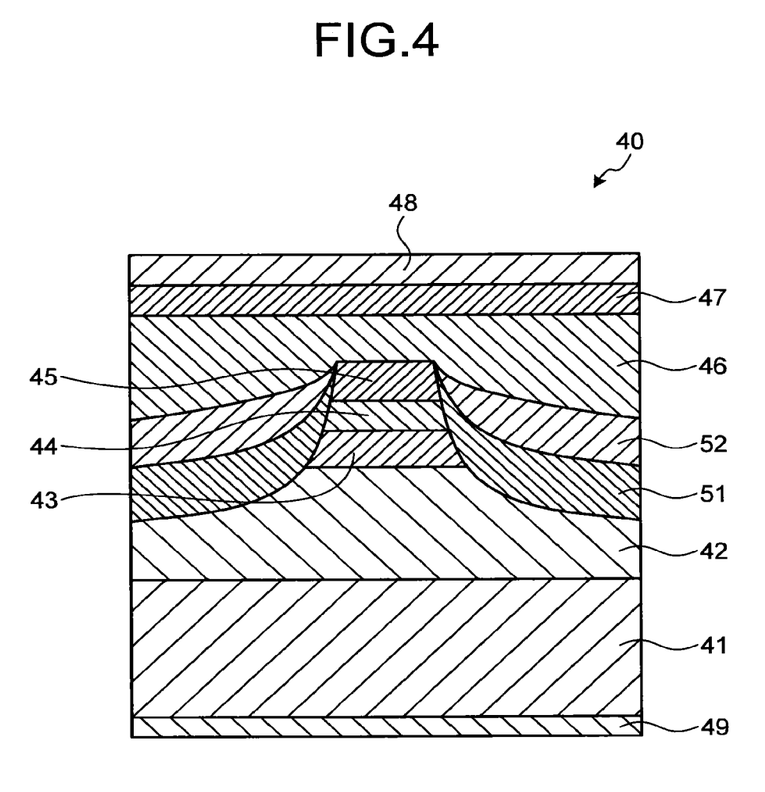
FIG. 4 is a schematic view illustrating a cross section of a semiconductor light-emitting unit of FIG. 3.

As illustrated in FIG. 4, the semiconductor light-emitting unit 40 has a buried hetero (BH) structure. In this semiconductor light-emitting unit 40, for example, a lower cladding layer 42 made of n-InP, a lower GRaded INdex Separate Confinement Heterostructure (GRIN-SCH) layer 43 made of non-doped GaInAsP, an active layer 44 having a multi-quantum well structure of a lattice-mismatched system made of GaInAsP, and an upper GRIN-SCH layer 45 made of non-doped GaInAsP are laminated in this order on one surface of a substrate 41 made of n-InP, and moreover, an upper cladding layer 46 made of p-InP and a contact layer 47 made of p-GaInAsP are laminated in this order so as to cover an upper GRIN-SCH layer 45. An upper electrode 48 that is a p-side electrode is formed to cover this contact layer 47. A lower electrode 49 that is an n-side electrode is formed on the other surface of the substrate 41.

A constriction for injecting an electric current to the active layer 44 is formed by laminating a p-InP layer 51 and an n-InP layer 52 in this order at side surfaces of the above-described lower cladding layer 42, a lower GRIN-SCH layer 43, the active layer 44, and the upper GRIN-SCH layer 45. In this laminated structure, the active layer 44 is configured to have a strained multi-quantum well structure. Specifically, the active layer 44 has a compressed and strained multi-quantum well structure so that lattice-mismatched ratio relative to the substrate 41 is equal to or greater than 0.5%.

Although the strained multi-quantum well structure is adopted here, a lattice-matched system of quantum well structure may be adopted as well.

It is preferable for achieving higher output of the semiconductor laser element 30 to adopt the lattice-mismatched system, that is, the strained quantum well structure since internal absorption inside the optical cavity decreases. For achieving this effect, it is preferable that the lattice-mismatched ratio be equal to or greater than 0.5%.

Hereafter, a method of manufacturing the semiconductor light-emitting unit 40 will be explained. The semiconductor light-emitting unit 40 may be manufactured by using a commonly known epitaxial growth method such as, for example, a metalorganic vapor deposition method, a liquid phase method, a molecular beam epitaxial growth method, a gas-source molecular beam epitaxial growth method, an actinic ray epitaxial growth method, or the like.

Specifically, the method of manufacturing the semiconductor light-emitting unit 40 includes: conducting epitaxial crystal growth of a predetermined semiconductor on the substrate 41 made of a predetermined semiconductor to form the above-described laminated structure; thereafter, conducting cleavage to achieve a predetermined cavity length; and then depositing a later-described low reflecting coating on one of cleaved surfaces to form the output-side reflection unit 31 (reflection layer). By depositing a high reflecting coating on the other one of the cleaved surfaces to form the rear-end-side reflection unit 32 and forming the lower electrode 49 on a back surface of the substrate 41 and the upper electrode 48 on the upper surface of the laminated structure, the semiconductor light-emitting unit 40 is manufactured.

Hereafter, a method of designing the semiconductor laser device 20 according to the present embodiment will be explained in more detail.

A laser light (pumping light) outputted by a semiconductor laser unit for Raman amplification may be subjected to stimulated Brillouin scattering in an optical fiber, particularly in an optical fiber for Raman amplification sometimes. In order to restrain the stimulated Brillouin scattering, the inventors have considered a method of designing a semiconductor laser unit for Raman amplification.

The semiconductor laser device including an optical cavity and an external optical cavity configured by the rear-end-side reflection unit and the second reflection unit has several oscillation modes. Specifically, The oscillation modes includes: an FBG mode oscillating only at the external optical cavity; an FP chip mode oscillating only at the optical cavity; a mode switching between the FBG mode and the Fabry-Perot (FP) chip mode alternately in high speed (low frequency fluctuation (LFF) mode); and a coexistence state mode switching between the FBG mode and the LFF mode in low speed (several milli seconds).

Moreover, the semiconductor laser device having the optical cavity and the external optical cavity includes a coherent collapse mode in which the FBG mode and the FP chip mode coexist with a same degree of gain and in an incoherent state.

The coherent collapse mode in an oscillation state becomes a stable multi-mode (spectrum area) in which a laser light output is stable. The inventors found out (see FIG. 5) that the semiconductor laser device may be oscillated in a coherent collapse state by controlling, in the semiconductor laser unit for Raman amplification, a distance between the output-side reflection unit and the second reflection unit and effective optical feedback adjusted based on the reflectivity $R_{AR}$ of the output-side reflection unit and the reflectivity $R_{FBG}$ of the second reflection unit so that an LFF period of the semiconductor laser device is equal to or less than predetermined time period.

Figure 5:
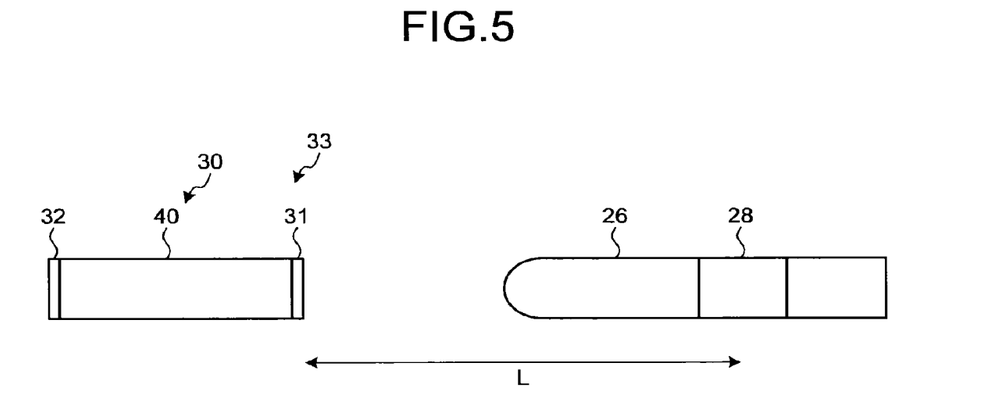
FIG. 5 is a schematic view for explaining position relationship between the semiconductor laser element and the optical fiber in the semiconductor laser device of FIG. 3.

Specifically, the distance between the output-side reflection unit and the second reflection unit represents a physical distance L between the output-side reflection unit 31 and the second reflection unit 28 As illustrated in FIG. 5. When the second reflection unit 28 is a distributed-type reflection unit such as a fiber Bragg Grating, a distance to the second reflection unit 28 is a distance to the center in a longitudinal direction.

Herein the LFF period represents an interval between a reference peak (minimum point at which intensity is the weakest) at which decrease in intensity is the greatest in a predetermined time period and the nearest adjacent peak at which the absolute value of the intensity (size of decrease in intensity) is equal to or greater than 60% of the above-described reference peak when measuring a relationship between intensity of a laser light outputted from the semiconductor laser device 20 and time. For example, when measuring the intensity of the laser light with an photodetector to convert its intensity to voltage, and in a case of measuring a relationship between the voltage and time, the interval represents an interval between the reference peak (the minimum point at which the intensity is the weakest) at which the decrease in the intensity is the greatest in the predetermined time period and the nearest adjacent peak at which the absolute value of the intensity (a size of decrease in the intensity) is equal to or greater than 60% of the above-described reference peak (see FIG. 9 and FIG. 11 which will be explained later). When there are peaks on both sides of the reference peak, the LFF period may be one of the peaks at which the time interval is narrower than the other one. The reference peak and a voltage difference between the reference peak and the above-described nearest adjacent peak (at which voltage is the highest in positive direction between two peaks) are equal to or greater than 30 mV (5% of average input power to the photodetector). In the later-described experiment system, 30 mV is converted to 0.1 mW in optical power and corresponds to 5% of optical power detected by a measurement instrument such as a power-meter or the like.

The semiconductor laser device 20 according to the embodiment of the present disclosure is conceived based on the above-described insight and designed to be configured as follows. That is, the semiconductor laser device 20 is configured so that the LFF period of the semiconductor laser device 20 is equal to or smaller than 20 ns by controlling the distance between the output-side reflection unit 31 and the second reflection unit 28 and effective optical feedback being adjusted in accordance with the reflectivity of the output-side reflection unit 31 and the reflectivity of the second reflection unit 28.

Herein, in the present embodiment, it is preferable that the LFF period of the semiconductor laser device 20 be equal to or smaller than 15 ns, and more preferably equal to or smaller than 5 ns.

Although there is not a lower limit for the LFF period of the semiconductor laser device 20 specifically, 0 ns indicates an ideal coherent collapse state, and it may be defined as a coherent collapse state if the LFF period is greater than 0 ns and equal to or smaller than 20 ns.

Moreover, in the present embodiment, it is preferable that a relationship between the physical distance L (cm) from the output-side reflection unit 31 to the second reflection unit 28 and effective optical feedback $\kappa$(1/ps) indicating the laser light outputted by the semiconductor laser element 30 and returned to the semiconductor laser element 30 again satisfy L>5333$\kappa$−33. Herein $\kappa$(1/ps) is $\kappa=(1/\tau)\times(1-R_{AR})\times(R_{FBG}/R_{AR})^{1/2}$ ... (1). In addition, $\tau$ is circulating time of a light in the semiconductor laser element 30 and is indicated by $\tau=2\times$(semiconductor laser element length)$\times$(group index of refraction)/(light velocity).

How to derive the above-described formula will be explained in detail in examples as follows.

That is, a preferred mode of the method of designing the semiconductor laser device 20 according to the embodiment of the present disclosure selects the semiconductor laser device of which the LFF period is equal to or smaller than 20 ns as the semiconductor laser device in which high speed switching occurs between the FBG mode and the FP mode to use the semiconductor laser device oscillating with the coherent collapse mode by controlling the distance between the output-side reflection unit 31 and the second reflection unit 28 and the effective optical feedback $\kappa$, of the semiconductor laser element 30, defined by the above-described formula (1) including the circulating time $\tau$ of the light in the semiconductor laser element 30, the reflectivity $R_{AR}$ of the output-side reflection unit 31, and the reflectivity $R_{FBG}$ of the second reflection unit 28. In order to find out the semiconductor laser device in which the high speed switching occurs between the FBG mode and the FP mode to conduct the above-described selection, the above-described control is conducted while measuring relationship between the intensity of the laser light outputted from the semiconductor laser device and time. When measuring the relationship between the intensity of the laser light outputted from the semiconductor laser device and time, the LFF period is defined as an interval between the reference peak at which the decrease in the intensity is the greatest in the predetermined time and the nearest adjacent peak at which the absolute value of the intensity is equal to or greater than 60% of the reference peak, and the one at which the LFF period defined as described above is equal to or smaller than 20 ns is determined and selected as the semiconductor laser device to be used.

Moreover, in the preferred mode of the semiconductor laser device 20 according to the embodiment of the present disclosure, the wavelength of the laser light outputted from the semiconductor laser element 30 is within a range of 1.3 μm to 1.6 μm, and the semiconductor laser device 20 is configured to select the semiconductor laser device of which LFF period is equal to or smaller than 20 ns as the semiconductor laser device in which the high speed switching occurs between the FBG mode and the FP mode to be oscillated with the coherent collapse mode by controlling the distance L between the output-side reflection unit 31 and the second reflection unit 28 and the effective optical feedback $\kappa$ to the semiconductor laser element 30 so that the relationship between the distance L (cm) between the output-side reflection unit 31 and the second reflection unit 28 and the effective optical feedback $\kappa$(1/ps) to the semiconductor laser element 30 defined by the above-described formula (1) including the circulating time $\tau$ of light in the semiconductor laser element 30, the reflectivity $R_{AR}$ of the output-side reflection unit 31, and the reflectivity $R_{FBG}$ of the second reflection unit 28. In order to find out the semiconductor laser device in which high speed switching occurs between the FBG mode and the FP mode to conduct the above-described selection, the above-described control is conducted while measuring the relationship between the intensity of the laser light outputted from the semiconductor laser device and time. When measuring the relationship between the intensity of the laser light outputted from the semiconductor laser device and time, a point at which the decrease in intensity is the greatest in a predetermined time period is the reference peak, an interval between the reference peak and the nearest adjacent peak in which the absolute value of the intensity is equal to or greater than 60% of the reference peak is defined as the LFF period, and the one in which the defined LFF period is equal to or smaller than 20 ns is determined and selected as the semiconductor laser device to be used.

In the method of designing the semiconductor laser device 20 according to the present embodiment configured as above and in the semiconductor laser device 20 using the method of designing the semiconductor laser device 20, the LFF period of the semiconductor laser device 20 is equal to or smaller than 20 ns by controlling the effective optical feedback adjusted in accordance with the distance between the output-side reflection unit 31 and the second reflection unit 28, the reflectivity of the output-side reflection unit 31, and the reflectivity of the second reflection unit 28. Hereby the oscillation mode of the semiconductor laser device becomes the coherent collapse mode, and thus the stimulated Brillouin scattering in the optical fiber 11 may be restrained.

Therefore, reliabilities of the Raman amplifier 10 and the optical communication system 100 provided with the semiconductor laser device 20 increase more.

Since, in the present embodiment, the semiconductor laser device 20 is designed to satisfy L>5333×κ−33, the semiconductor laser element 30 may be oscillated with the coherent collapse state more reliably. Hereby, the light outputted by the semiconductor laser device 20 may be restrained from being subjected to stimulated Brillouin scattering in the optical fiber 11 reliably.

It is preferable that, in the present embodiment, the semiconductor laser device 20 be used at the outputted laser light intensity within a range of 20 mW to 50 mW. Since the above-described LFF period of the semiconductor laser device 20 is equal to or smaller than 20 ns, it is possible to restrain the laser light being outputted from being subjected to stimulated Brillouin scattering in the optical fiber 11 even when optical intensity is low such as equal to or smaller than 50 mW.

The present disclosure is not limited to the above-described embodiment. The present disclosure includes a configuration appropriately combining the above-described elements. Further effects or modification examples may be easily derived by an ordinary skilled person in the art. Therefore, further wide aspects of the present disclosure are not limited to the specific, detailed, and various modifications may be made.

First Embodiment

Hereafter, Examples of the present disclosure will be explained. Hereafter, a verification experiment will be explained for an effect of restraining stimulated Brillouin scattering in the semiconductor laser device according to Examples of the present disclosure. Firstly, First embodiment will be explained.

Figure 6:
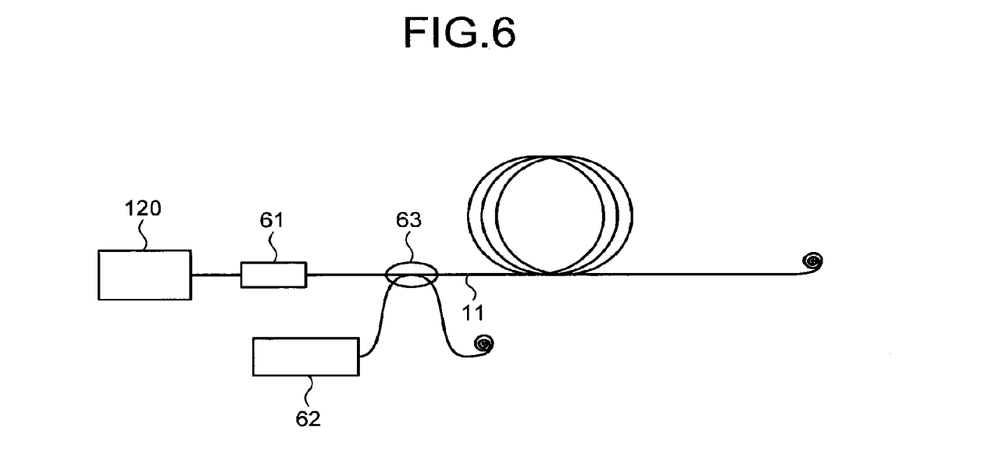
FIG. 6 is a schematic view for explaining an experiment device measuring fluctuation ratio of reflection amount by stimulated Brillouin scattering of a laser light outputted by the semiconductor laser device.

FIG. 6 is a schematic view illustrating an experiment device for verifying as to whether or not the light outputted by the semiconductor laser device is subjected to stimulated Brillouin scattering. As illustrated in FIG. 6, this experiment device includes a semiconductor laser device 120 outputting a pumping light for Raman amplification, the optical fiber 11 in which the laser light outputted by this semiconductor laser device 120 is propagated, an optical isolator 61 disposed at an output side of the semiconductor laser device 120, a power-meter 62 measuring intensity of an optical feedback, and an optical coupler 63 making the laser light being outputted by the semiconductor laser device 120 be inputted to the optical fiber 11 and making the optical feedback be inputted to the power-meter 62.

The semiconductor laser device 120 has a basic configuration similar to that of the semiconductor laser device 20 explained in the above-described embodiment. However, the semiconductor laser device 120 is designed under conditions of respective Examples and a comparative example described below. Specifically, the experiment was conducted by setting the reflectivity $R_{FBG}$ of the second reflection unit and the physical distance L between the output-side reflection unit and the second reflection unit or the like at various values. In the present Example, the semiconductor laser device 120 is used in which optical power is 20 mW and oscillation wavelength is <FBG center wavelength (reflection center wavelength of the second reflection unit) when the optical cavity is alone and without an FBG.

The optical fiber 11 is an optical fiber for Raman amplification, and when a laser light (pumping light) outputted from the semiconductor laser device 120 is input thereto, stimulated Brillouin scattering or the like occurs and is returned to an isolator 61 and the p-InP layer as an optical feedback. The optical isolator 61 is provided to prevent the optical feedback from being returned to the semiconductor laser device 120.

In Examples, as to whether or not there was stimulated Brillouin scattering was confirmed by obtaining fluctuation ratio of the reflection amount by using the above-described experiment device. Hereafter the method of measuring the fluctuation ratio of the reflection amount will be explained.

In Examples, the maximum value $P_{max}$ of the reflection amount, the minimum value $P_{min}$ of the reflection amount, and the average value $P_{ave}$ of the reflection amount were measured, and then, the fluctuation ratio of the reflection amount was calculated by the formula below:

(Fluctuation ratio of reflection amount)=$(P_{max}-P_{min})/P_{ave}$.

Herein, the maximum value $P_{max}$ of the reflection amount and the minimum value $P_{min}$ of the reflection amount are the maximum measurement value and the minimum measurement value measured by the power-meter 62, and the average value $P_{ave}$ of the reflection amount is an average value measured by the power-meter 62.

If a laser light (pumping light) is inputted to the optical fiber 11 for use in optical amplification, Rayleigh scattering light or the like is observed normally, but if stimulated Brillouin scattering occurs, the fluctuation ratio of the reflection amount increases.

Herein, the fluctuation ratio of the reflection amount is substantially constant at the coherent collapse mode, the FBG mode, and the FP mode. In this state, if a relationship between $R_{AR}$ and $R_{FBG}$ satisfies a relationship of 1/100× $R_{AR}$<$R_{FBG}$<100×$R_{AR}$, and if the fluctuation ratio of the reflection amount is constant, it is possible to understand that it is the coherent collapse state.

As described above, fluctuation ratios of reflection amounts were measured for Examples 1 to 6 and for a comparative example 1. Equal to or smaller than 10% of the fluctuation ratio of the reflection amount was evaluated as "Good" because stimulated Brillouin scattering is prevented, and exceeding 10% of the fluctuation ratio of the reflection amount was evaluated as "Poor" because stimulated Brillouin scattering occurs.

Figure 7:
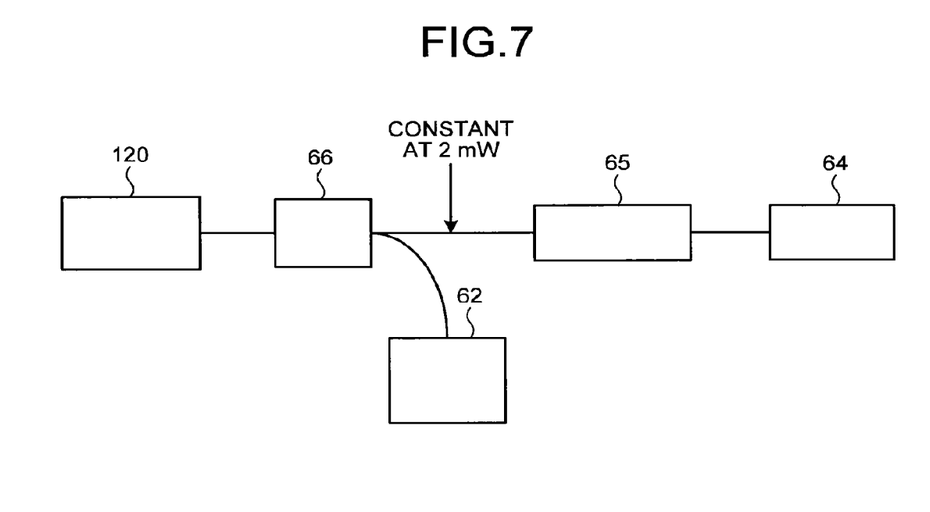
FIG. 7 is a schematic view for explaining a method of measuring an instantaneous temporal waveform in a method of measuring the fluctuation ratio of the reflection amount of FIG. 6.

Moreover, in Example 1, in order to determine as to whether or not the oscillation mode of the semiconductor laser device 120 is in the coherent collapse state, the method of measuring an instantaneous temporal waveform shown in FIG. 7 was adopted. Herein, the confirmation of oscillation mode was conducted by evaluating a voltage-time waveform by an oscilloscope 64. In order to grasp the output from the semiconductor laser device 120, the power-meter 62 was used as well. In addition, an optical attenuator 66 was provided between the semiconductor laser device 120 and a photodetector 65. The photodetector 65 is provided with a photo-diode, receives a laser light attenuated by the optical attenuator 66, and outputs an electric current in a value corresponding to its intensity to the oscilloscope 64. The oscilloscope 64 converts the inputted electric current to a voltage value.

The photodetector 65 and the oscilloscope 64 were used of which response frequencies are sufficiently higher than several tens MHz as an oscillation period of the LFF mode. As a trigger of the oscilloscope 64, an internal trigger was used. At a time of measurement by the oscilloscope 64, a DC component was removed and the voltage-time waveform was measured for five minutes. Photoelectric conversion effectivity of the photodetector 65 was 300 V/W, and power to the photodetector 65 was made constant at 2 mW. Temporal resolution was set at equal to or smaller than 1 ns.

Experiments were conducted to Examples 1 to 6 and the comparative example 1 under conditions shown in Table 1 to obtain respective LFF periods.

Figure 8:
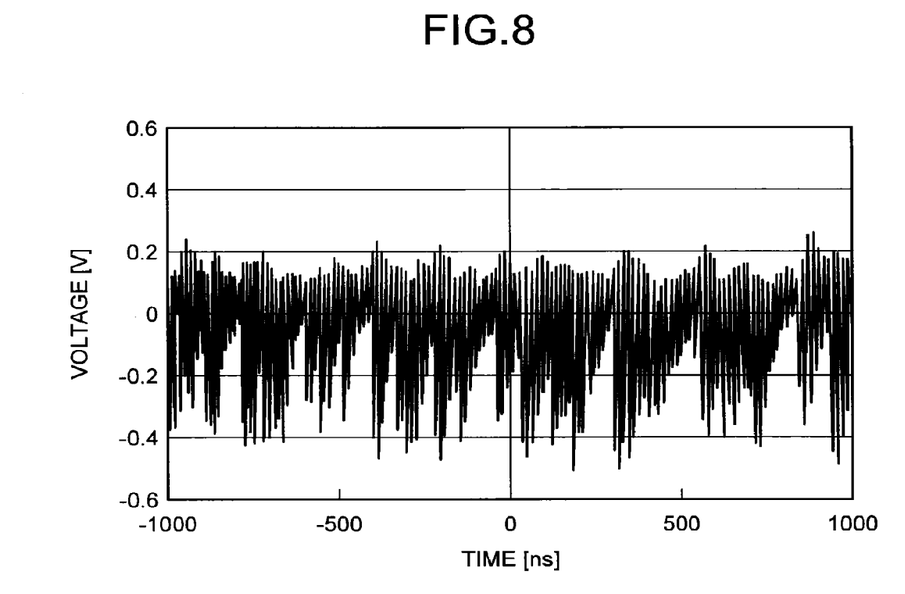
FIG. 8 is a view illustrating results of an experiment in Example 1.
Figure 9:
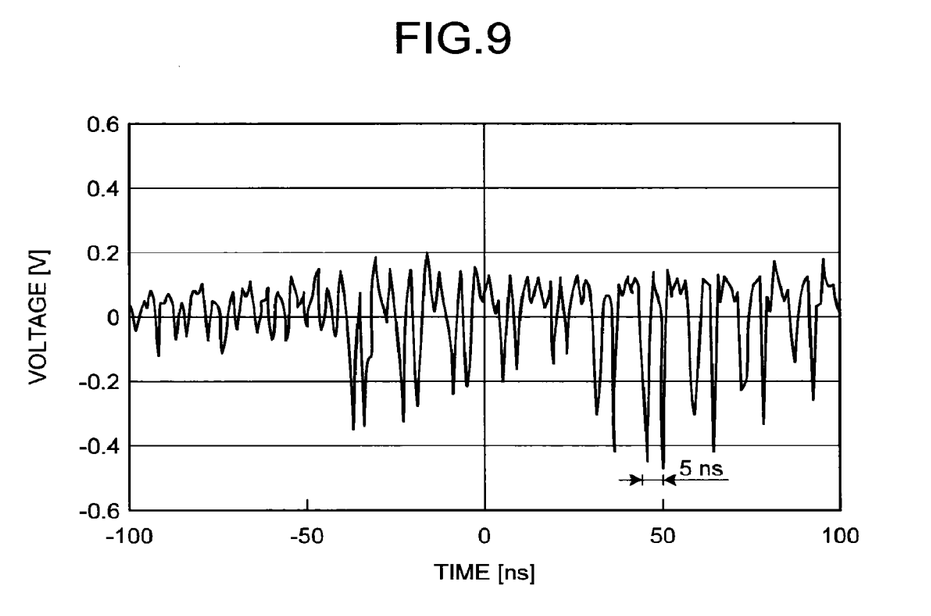
FIG. 9 is an enlarged view of a part of the results of the experiment of FIG. 8.
Figure 10:
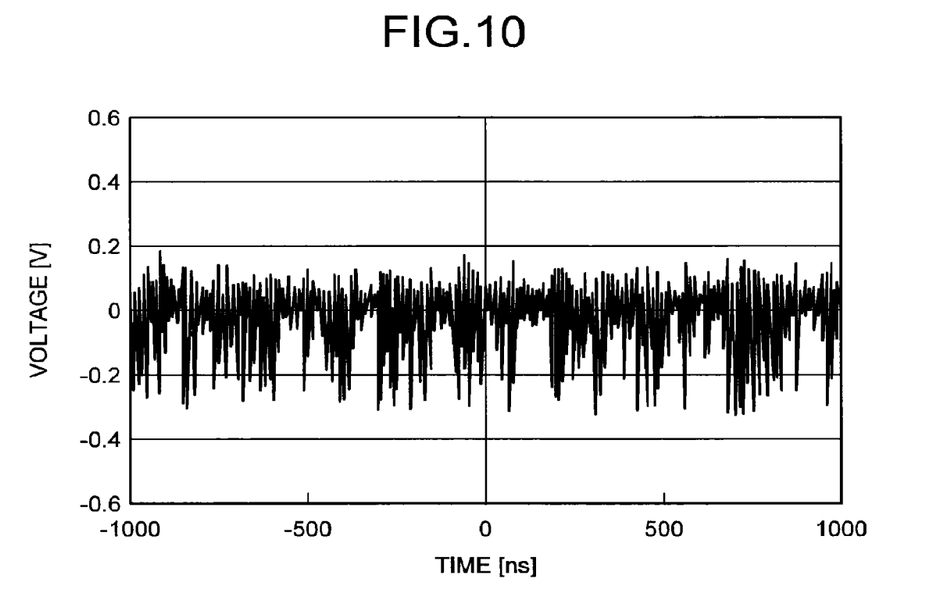
FIG. 10 is a view illustrating results of an experiment in Example 6.
Figure 11:
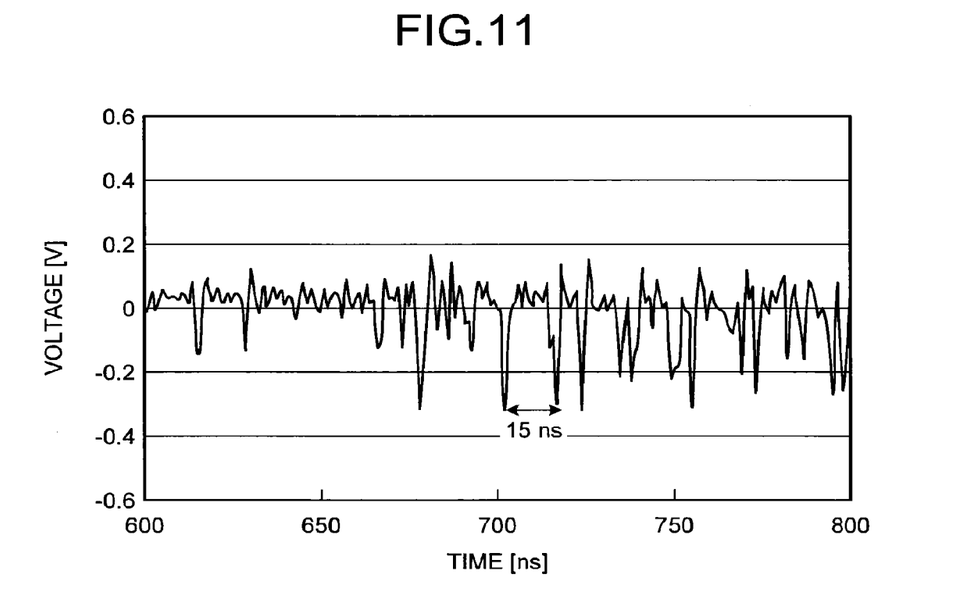
FIG. 11 is an enlarged view of a part of the results of an experiment of FIG. 10.

Results of the above-described experiments are shown in Table 1. Table 1 also shows a value of κ. As examples of measurement results for the voltage-time waveform, FIG. 8 and FIG. 9 show the result of Example 1, and FIG. 10 and FIG. 11 show the result of Example 6.

TABLE 1

| | Optical cavity length (mm) | L (cm) | $R_{FBG}$ (%) | $R_{AR}$ (%) | Electric current (mA) | κ (1/ps) | LFF period (ns) | Evaluation |
|---|---|---|---|---|---|---|---|---|
| Example 1 | 2.0 | 140 | 1.8 | 1.5 | 100 | 0.0243 | 5 | Good |
| Example 2 | 4.0 | 300 | 10.0 | 0.5 | 200 | 0.0497 | 8 | Good |
| Example 3 | 1.0 | 300 | 1.8 | 1.5 | 50 | 0.0486 | 8 | Good |
| Example 4 | 2.0 | 170 | 0.1 | 10.0 | 100 | 0.0022 | 10 | Good |
| Example 5 | 6.0 | 140 | 1.8 | 1.5 | 300 | 0.0081 | 11 | Good |
| Example 6 | 0.5 | 100 | 0.1 | 10.0 | 25 | 0.0088 | 15 | Good |
| Comparative example 1 | 2 | 100 | 3.6 | 1.5 | 100 | 0.0344 | 25 | Poor |

As shown in Table 1, the LFF periods are equal to or smaller than 20 ns in Examples 1 to 6, and thus it was confirmed that the fluctuation ratio of the reflection amount was small and stimulated Brillouin scattering was prevented. On the other hand, in the comparative example 1, the LFF period was 25 ns and the fluctuation ratio of the reflection amount was great, and thus stimulated Brillouin scattering occurred.

Second Embodiment

In Second embodiment, the LFF period and the fluctuation ratio of the reflection amount were measured by using an experiment device similar to that being explained in Examples 1 (see FIGS. 6 and 7) and by setting an electric current value (driving current value) of the semiconductor laser device at 100 mA to 200 mA.

Conditions for the experiment was set as follows.

Experiment Conditions for Example 7

Optical cavity length: 2.0 mm
Physical distance L between the output-side reflection unit and the second reflection unit: 180 cm
$R_{FBG}$: 1.8%
$R_{AR}$: 1.5%

Experiment Conditions for Comparative Example 2

Optical cavity length: 2.0 mm
Physical distance L between the output-side reflection unit and the second reflection unit: 100 cm
$R_{FBG}$: 3.6%
$R_{AR}$: 1.5%

Figure 12:
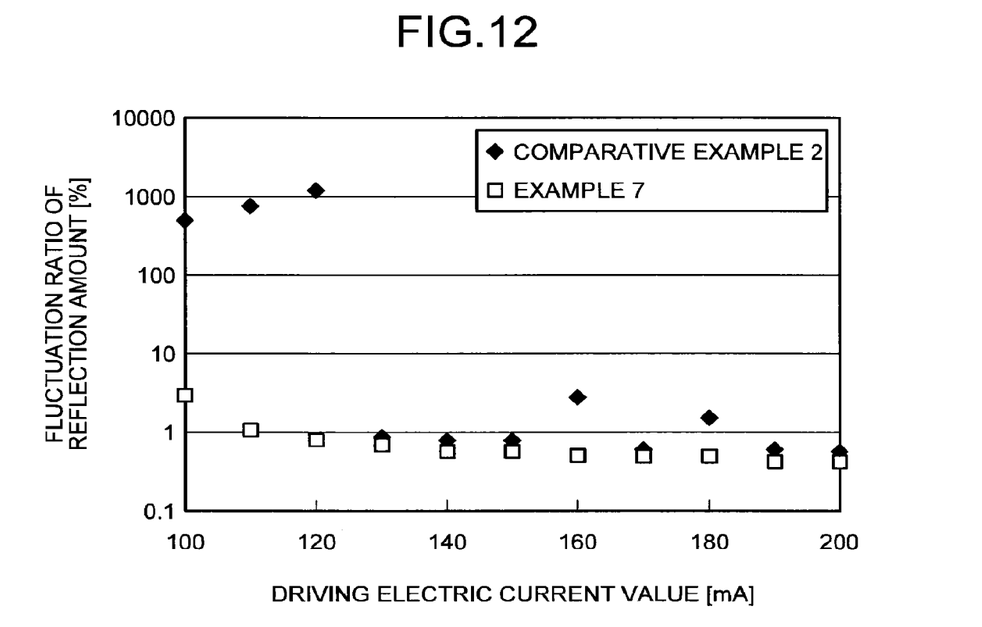
FIG. 12 is a view illustrating results of the experiment in Second embodiment.

FIG. 12 shows the results of evaluations for the fluctuation ratio of the reflection amount.

As illustrated in FIG. 12, in Example 7, it was confirmed that, within a range of 100 mA to 200 mA of the electric current value, the fluctuation ratio of the reflection amount was small and equal to or smaller than 10%, and thus, stimulated Brillouin scattering was restrained. Also, it was confirmed that the LFF period of Example 7 was equal to or smaller than 20 ns.

On the other hand, it was confirmed that, in the comparative example 2, the fluctuation ratio of the reflection amount was approximately one thousand times within a range of 100 to 120 mA of the electric current value in comparison to a range of 130 to 200 mA of electric current value, and thus stimulated Brillouin scattering occurred. Also, it was confirmed that the LFF period of the comparative example 2 exceeded 20 ns.

Herein, 100 mA of electric current value corresponds to 20 mW of laser light intensity. Also herein, 120 mA of electric current value corresponds to 50 mW of laser light intensity.

Third Embodiment

Figure 13:
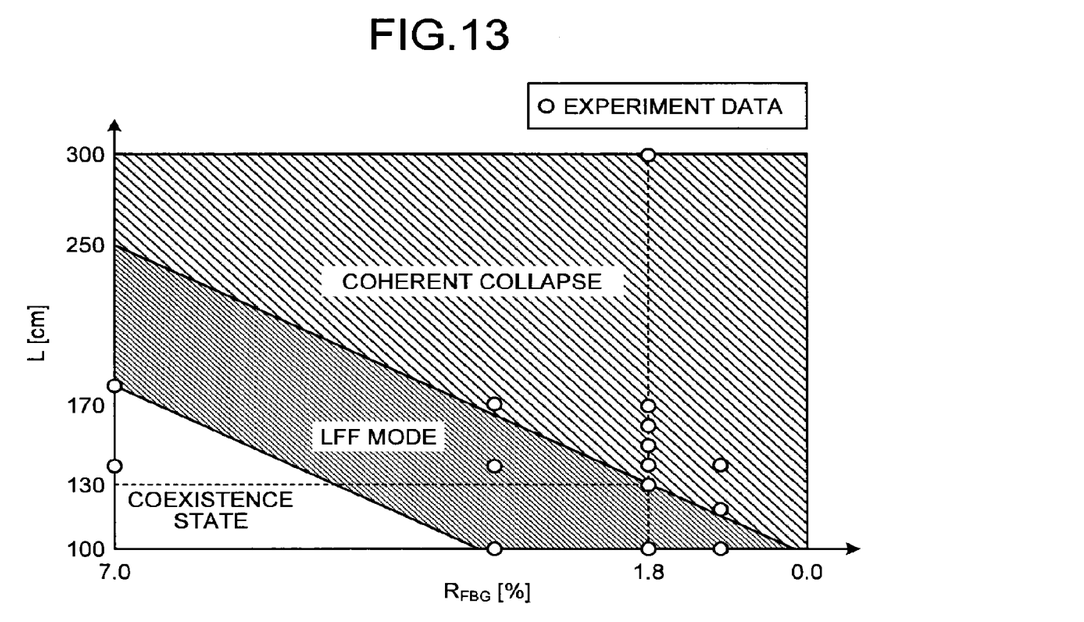
FIG. 13 is a view illustrating a relationship between L and $R_{FBG}$ in an oscillation mode of the semiconductor laser device according to Third embodiment.

FIG. 13 shows a relationship of the oscillation mode of the semiconductor laser element relative to the reflectivity $R_{FBG}$ of the second reflection unit in the semiconductor laser device 120 and the distance L between the output-side reflection unit and the second reflection unit. Respective plotted points in this FIG. 13 are summarization of results of various experiments conducted similarly to Examples 1.

From FIG. 13, it is understood that the oscillation mode of the semiconductor laser device 120 is in the coherent collapse state at a time of L(cm)>23×$R_{FBG}$(%)+89.

However, there is a limitation that wavelength cannot be pulled unless $R_{FBG}$ is equal to or greater than 1.8%. Herein pulling of wavelength means that the laser emission wavelength of the semiconductor laser device 120 is puled to a reflection center wavelength of the second reflection unit.

In consideration of cost of the semiconductor laser device 120, it is desirable that the distance L between the output-side reflection unit and the second reflection unit be as short as possible.

Herein the reflectivity $R_{FBG}$ in FIG. 13 is replaced with the effective optical feedback κ.

$$\kappa = (1/\tau) \times (1-R_{AR}) \times (R_{FBG}/R_{AR})^{1/2}$$

where τ is circulating time of the light in the semiconductor laser element. Since the optical cavity length of the semiconductor laser element used in Examples was 2.0 mm and the group index of refraction was 3.4, τ is 45 ps. Also, the semiconductor laser element is used of which $R_{AR}$ is 1.2%.

Figure 14:
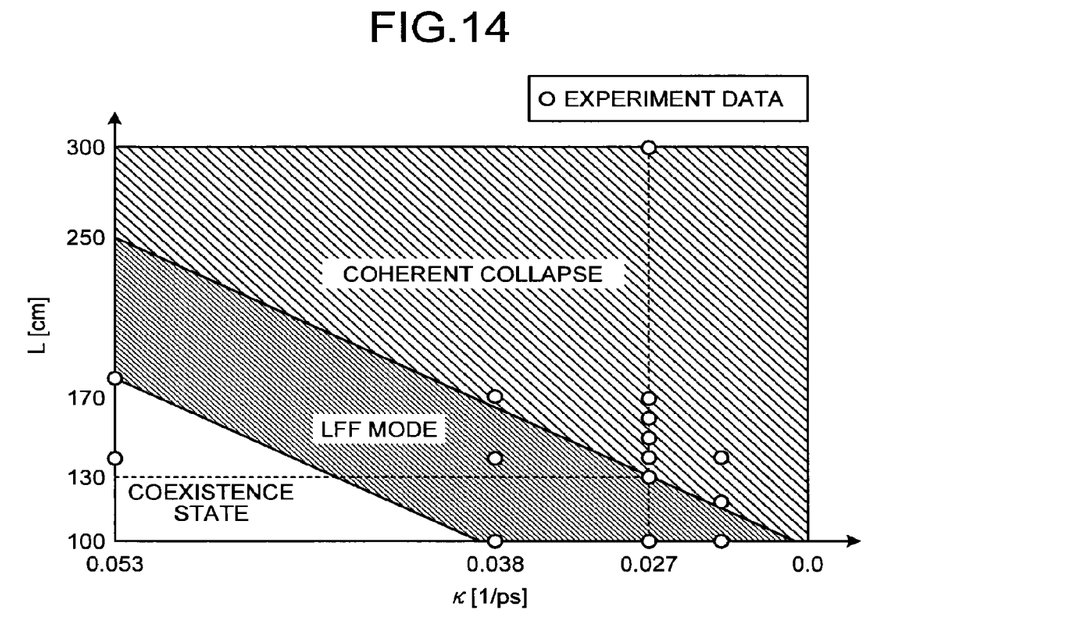
FIG. 14 is a view illustrating a relationship between L and κ in the oscillation mode of the semiconductor laser device according to Third embodiment.

FIG. 14 shows the relationship, of the oscillation mode of the semiconductor laser element, relative to the reflectivity $R_{FBG}$ of the second reflection unit in the semiconductor laser device 120 and the effective optical feedback κ, replacing the relationship shown in FIG. 13 with the effective optical feedback κ as such.

The relationship of the above-described $\kappa=(1/\tau) \times (1-R_{AR}) \times R_{FBG}/R_{AR})^{1/2}$ is described in detail in, for example, Tkach, R. W. et al., Lightwave Technology, Journal Volume 4, Issue 11.

The condition for making the semiconductor laser element oscillate in the coherent collapse state is obtained as L>5333×κ−33.

This linear approximate expression is satisfied within ranges of 0.0 to 0.053 of the effective optical feedback κ(1/ps), 0 to 7% of the reflectivity $R_{AR}$(%) of the output-side reflection unit, and 0.2 mm to 10 mm of the optical cavity length of the semiconductor laser element. There is a limitation that wavelength cannot be pulled unless κ is equal to or greater than 0.027 (1/ps).

As described above, the relationship of L>5333×κ−33 explained in the above-described embodiment may be derived, and when L and κ satisfy this relationship, the oscillation mode of the semiconductor laser device 120 can be in the coherent collapse state reliably and thus, it is possible to restrain stimulated Brillouin scattering from occurring.

According to the present disclosure, there may be provided a method of designing a semiconductor laser device capable of restraining stimulated Brillouin scattering in an optical fiber caused by a laser light outputted by a semiconductor laser device used in a pumping light source for Raman amplification, a method of designing a Raman amplifier, a method of manufacturing a semiconductor laser device, a semiconductor laser device, a Raman amplifier, and an optical communication system.

The method of designing the semiconductor laser device, the method of designing the Raman amplifier, the method of manufacturing the semiconductor laser device, and the semiconductor laser device according to the present disclosure are suitable for use in the semiconductor laser device used for a pumping light source for Raman amplification.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A method of designing a semiconductor laser device used for a pumping light source for Raman amplification and including: a semiconductor laser element including an optical cavity including a semiconductor light-emitting unit and a first reflection unit reflecting a light outputted by the semiconductor light-emitting unit; and a second reflection unit disposed at a laser-light-output side of the semiconductor laser element, wherein the first reflection unit includes an output-side reflection unit provided at the laser-light-output side and a rear-end-side reflection unit provided at an opposite side to the laser-light-output side, the method of designing comprising:
controlling: a physical distance L (cm) between the output-side reflection unit and the second reflection unit; and an effective optical feedback κ(1/ps) to the semiconductor laser element, the effective optical feedback κ(1/ps) defined by a below-presented formula (1) including a circulating time τ of the light in the semiconductor laser element, a reflectivity $R_1$ of the output-side reflection unit, and a reflectivity $R_2$ of the second reflection unit;
selecting the semiconductor laser device in which a Low Frequency Fluctuation (LFF) period is equal to or smaller than 20 ns as the semiconductor laser device in which a high speed switching occurs between a Fiber Bragg Grating (FBG) mode and a Fabry-Perot (FP) mode; and
using the selected semiconductor laser device as a semiconductor laser device oscillating in a coherent collapse mode,
wherein the controlling is performed while measuring a relationship between an intensity of the laser light outputted from the semiconductor laser device and time to perform the selecting by finding out the semiconductor laser device in which the high speed switching occurs between the FBG mode and the FP mode,
when measuring the relationship between the intensity of the laser light outputted from the semiconductor laser device and the time to perform the selecting, the LFF period is defined as an interval between a reference peak at which a decrease in the intensity is greatest in a predetermined time period and a nearest adjacent peak of which absolute value of the intensity is equal to or greater than 60% of the reference peak, and
the semiconductor laser device at a time the defined LFF period is equal to or smaller than 20 ns is determined and selected as the semiconductor laser device to be used $$\kappa=(1/\tau) \times (1-R_1) \times (R_2/R_1)^{1/2} \qquad (1).$$

2. The method of designing according to claim 1, wherein the intensity of the laser light outputted from the semiconductor laser device is set at equal to or smaller than 50 mW.

3. The method of designing according to claim 1, wherein the intensity of the laser light outputted from the semiconductor laser device is set at equal to or greater than 20 mW.

4. The method of designing according to claim 1, wherein
a wavelength of the laser light outputted from the semiconductor laser element is within a range of 1.3 μm to 1.6 μm, and
a relationship between the physical distance L (cm) between the output-side reflection unit and the second reflection unit and the effective optical feedback κ(1/ps) satisfies a relationship of L>5333×κ−33.

5. A semiconductor laser device used for a pumping light source for Raman amplification and including: a semiconductor laser element including an optical cavity including a semiconductor light-emitting unit and a first reflection unit reflecting a light outputted by the semiconductor light-emitting unit; and a second reflection unit disposed at a laser-light-output side of the semiconductor laser element, wherein the first reflection unit includes an output-side reflection unit provided at the laser-light-output side and a rear-end-side reflection unit provided at an opposite side to the laser-light-output side, wherein a wavelength of a laser light outputted from the semiconductor laser element is within a range of 1.3 μm to 1.6 μm, by controlling: a physical distance L (cm) between the output-side reflection unit and the second reflection unit; and an effective optical feedback κ(1/ps) to the semiconductor laser element so that a relationship between the physical distance L (cm) and the effective optical feedback κ(1/ps) defined by a below-presented formula (1) including a circulating timer τ of the light in the semiconductor laser element, a reflectivity $R_1$ of the output-side reflection unit, and a reflectivity $R_2$ of the second reflection unit satisfies a relationship of L>5333κ−33, the semiconductor laser device is a semiconductor laser device in which a Low Frequency Fluctuation (LFF) period is equal to or smaller than 20 ns selected as a semiconductor laser device in which a high speed switching occurs between a Fiber Bragg Grating (FBG) mode and a Fabry-Perot (FP) mode to oscillate in a coherent collapse mode, in order to find out, and conduct the selection of, the semiconductor laser device in which the high speed switching occurs between the FBG mode and the FP mode, the controlling is conducted while measuring a relationship between an intensity of the laser light outputted from the semiconductor laser device and time to conduct the selection, when measuring the relationship between the intensity of the laser light outputted from the semiconductor laser device and the time to conduct the selection, the LFF period is defined as an interval between a reference peak at which a decrease in the intensity is the greatest in a predetermined time period and a nearest adjacent peak of which absolute value of the intensity is equal to or greater than 60% of the reference peak, and the semiconductor laser device at a time when the defined LFF period is equal to or smaller than 20 ns is determined and selected to be used $$\kappa = (1/\tau) \times (1-R_1) \times (R_2/R_1)^{1/2} \qquad (1).$$

6. The semiconductor laser device according to claim 5, wherein the intensity of the outputted laser light is set at equal to or smaller than 50 mW.

7. The semiconductor laser device according to claim 5, wherein the intensity of the outputted laser light is set at equal to or greater than 20 mW.

* * * * *